US010976656B2

(12) United States Patent
Yoshikawa (10) Patent No.: US 10,976,656 B2
(45) Date of Patent: Apr. 13, 2021

(54) DEFECT INSPECTION DEVICE AND DEFECT INSPECTION METHOD

(71) Applicant: TOSHIBA MEMORY CORPORATION, Tokyo (JP)

(72) Inventor: Ryoji Yoshikawa, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 146 days.

(21) Appl. No.: 16/119,977

(22) Filed: Aug. 31, 2018

(65) Prior Publication Data

US 2019/0285980 A1 Sep. 19, 2019

(30) Foreign Application Priority Data

Mar. 19, 2018 (JP) .............................. JP2018-051388

(51) Int. Cl.
| | | |
|---|---|---|
| G03F 1/84 | (2012.01) | |
| G06T 7/00 | (2017.01) | |
| G01N 21/956 | (2006.01) | |
| G01N 21/88 | (2006.01) | |

(52) U.S. Cl.
CPC ........... *G03F 1/84* (2013.01); *G01N 21/8851* (2013.01); *G01N 21/95607* (2013.01); *G06T 7/001* (2013.01); *G01N 2021/8887* (2013.01); *G01N 2021/95676* (2013.01); *G06T 2207/30164* (2013.01)

(58) Field of Classification Search
CPC ........... G06T 2207/20021; G06T 7/001; G06T 2207/30164; G06T 7/0004; G06T 2207/30148; G01N 2021/95676; G01N 2021/8887; G01N 21/95607; G01N 21/8851; G03F 1/84
See application file for complete search history.

(56) References Cited

U.S. PATENT DOCUMENTS

| | | | |
|---|---|---|---|
| 7,602,961 B2 | 10/2009 | Yoshikawa et al. | |
| 2008/0205747 A1* | 8/2008 | Kuchii | ...................... G06T 5/20 382/149 |
| 2009/0303323 A1* | 12/2009 | Yoshikawa | ...... G01N 21/95607 348/92 |
| 2010/0283847 A1* | 11/2010 | Aikawa | .............. G01N 21/8803 348/142 |
| 2012/0019692 A1* | 1/2012 | Tatsuzawa | ............. H04N 5/225 348/246 |
| 2013/0208974 A1* | 8/2013 | Nakano | ................... G06T 7/001 382/149 |

FOREIGN PATENT DOCUMENTS

| | | |
|---|---|---|
| JP | 2002-244275 A | 8/2002 |
| JP | 2017-138250 A | 8/2017 |

* cited by examiner

*Primary Examiner* — Yon J Couso
(74) *Attorney, Agent, or Firm* — Kim & Stewart LLP (57) ABSTRACT

A defect inspection device includes an image sensor configured to obtain an image of a target region of an object and divide the image of the target region into an array of pixels, and a processor. The processor is configured to receive a signal indicating a value of a property of the divided image, select a first pixel in the divided image, determine the value of the property of the first pixel, determine a reference pixel value for the first pixel, compare the reference pixel value to the value of the first pixel to obtain a difference value, and set a threshold difference at which a defect is assessed to be present, based at least in part on the value of the property of second pixels in the divided image adjacent to the first pixel.

22 Claims, 12 Drawing Sheets

DEFECT INSPECTION DEVICE AND DEFECT INSPECTION METHOD

CROSS-REFERENCE TO RELATED APPLICATION

This application is based upon and claims the benefit of priority from. Japanese Patent Application No. 2018-051388, filed Mar. 19, 2018, the entire contents of which are incorporated herein by reference.

FIELD

Embodiments described herein relate generally to a defect inspection device and a defect inspection method.

BACKGROUND

In defect inspection of a photomask used in a lithographic process, a value obtained by comparing image data of the photomask to reference data in accordance with a predetermined algorithm is compared to a defect determination threshold determined in each predetermined region in which an evaluation of the photomask is performed. However, in a photomask or the like with a pattern of which a half pitch is less than 20 nm, a gray scale value of an inspection image in the predetermined region may be changed due to a change in an amount of illumination light and a variation of the shape of the pattern of the photomask.

DETAILED DESCRIPTION

Embodiments provide a defect inspection device and a defect inspection method capable of inspecting stable measurement intensity irrespective of a change in a gray scale value of an inspection image caused due to a change in an amount of illumination light or a shape variation on an inspection sample surface.

In general, according to one embodiment, there is provided a defect inspection device that includes an image sensor configured to obtain an optical image of an inspection target region of an object and divide the optical image of the inspection target region into an array of pixels of a predetermined two-dimensional size, and a processor configured to receive a signal indicative of a value of a property of the divided optical image created by the image sensor, select a pixel of the array of pixels in the divided optical image created by the image sensor as a first pixel, determine the value of the property of the first pixel, determine a reference pixel value for the first pixel, compare the reference pixel value to the value of the first pixel to obtain a difference value, and set a threshold difference of the difference value between the value of the reference pixel and the value of the first pixel at which a defect is assessed to be present, based at least in part on the value of the property of second pixels in the divided optical image adjacent to the first pixel.

Hereinafter, a defect inspection device and a defect inspection method according to embodiments will be described in detail with reference to the appended drawings. The present disclosure is not limited to the embodiments.

First Embodiment

In a first embodiment, a defect inspection device and a defect inspection method capable of performing die to database inspection to compare an optical image of an physical inspection target manufactured based on design data to a reference image generated from the design data of the inspection target will be described.

Figure 1:
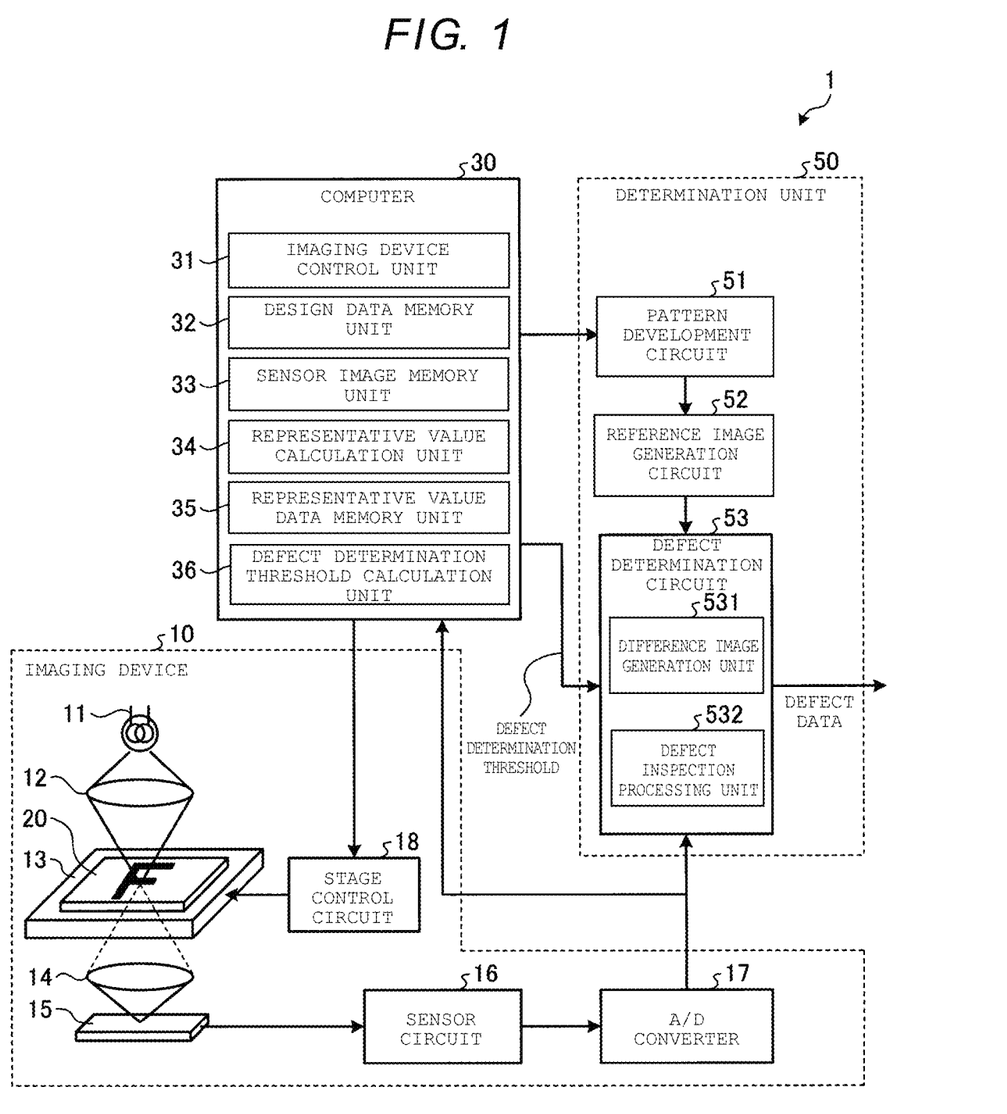
FIG. 1 is a diagram schematically illustrating an example of a configuration of a defect inspection device according to a first embodiment.

FIG. 1 is a diagram schematically illustrating an example of a configuration of a defect inspection device according to a first embodiment. A defect inspection device 1 includes an imaging device 10, a computer 30, and a determination unit 50.

The imaging device 10 is a device that images, i.e., it obtains, an optical image of a photomask or a template which is an inspection target. On the photomask, a pattern to be transferred to a resist layer is formed on the mask substrate and transferred to a layer of the mask substrate using a lithographic process. The photomask may be a transmissive photomask or a reflective mask. In the template, an uneven pattern to be brought into contact with a resist layer on a wafer through an imprinting process is formed on a template substrate. In the drawing, light is radiated to an inspection target and an optical image formed by the transmitted light is imaged into the resist, or a layer on the mask is directly ablated thereby.

The imaging device 10 includes a light source 11, a condensing optical system 12, a stage 13, an objective lens 14, an image sensor 15, a sensor circuit 16, an A/D converter 17, and a stage control circuit 18. The light source 11 radiates light of a predetermined wavelength to the inspection target 20, which may or may not be visible to the human eye. A mercury lamp, an argon laser, or the like is used as the light source 11. The condensing optical system 12 condenses light from the light source 11 on the inspection target 20 on the stage 13. The condensing optical system 12 includes, for example, a condensing lens.

The stage 13 holds the inspection target 20. The stage 13 is configured so that the inspection target 20 is movable in horizontal two-axis directions (XY directions). The objective lens 14 condenses light transmitted through or reflected from the inspection target 20.

The image sensor 15 captures an image formed by the light transmitted through or reflected from the inspection target 20. For example, a charge coupled devices (CCD) sensor in which optical imaging elements such as CCDs are arranged one-dimensionally or two-dimensionally can be used as the image sensor 15. Even when a light reception area of the image sensor 15 is small, a pattern image of a whole pattern disposition region of the inspection target 20 can be imaged by moving the inspection target 20 relatively to the image sensor 15 in the X and Y directions. In the image sensor 15, for example, a pattern image of the inspection target 20 is expanded several hundred times to be formed by an optical system such as the condensing optical system 12 or the objective lens 14. Depending on characteristics of the inspection target 20, not only transmitted light, but reflected light or light in which the reflected light and the transmitted light are mixed may reach the image sensor 15. The light source 11, the condensing optical system 12, the stage 13, the objective lens 14, and the image sensor 15 are disposed on an optical axis.

The sensor circuit 16 outputs an optical image in accordance with a pattern image of the inspection target 20 obtained by scanning the inspection target 20, from the image sensor 15. A pixel size of the optical image is, for example, 50 nm×50 nm.

Since the optical image output from the sensor circuit 16 is in an analog state, the A/D converter 17 converts the optical image into a digital image. Here, for example, the optical image is converted into a sensor image based on 256 gray scales values. The A/D converter 17 outputs the sensor image to the computer 30 and the determination unit 50.

The stage control circuit 18 scans the whole pattern disposition region of the inspection target 20 by moving the stage 13 into the X and Y directions under the control of the computer 30.

For example, the computer 30 controls the imaging device 10 and calculates a defect determination threshold using the sensor image captured by the imaging device 10. The computer 30 includes an imaging device control unit 31, a design data memory unit 32, a sensor image memory unit 33, a representative value calculation unit 34, a representative value data memory unit 35, and a defect determination threshold calculation unit 36.

The imaging device control unit 31 controls the imaging device 10. For example, the imaging device control unit 31 instructs the stage control circuit 18 to transmit the position of the stage 13 at the time of imaging. The stage control circuit 18 outputs an instruction to move the stage 13 based on the instruction to a driving unit (not illustrated) driving the stage 13.

The design data memory unit 32 stores the design data which is pattern data of the inspection target 20. The sensor image memory unit 33 stores the sensor image output from the sensor circuit 16.

Figure 2A:
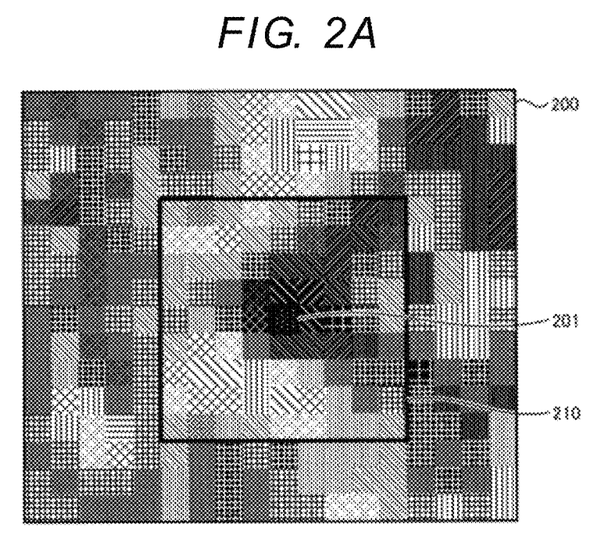
FIGS. 2A and 2B are diagrams illustrating an example of a representative value calculation method.
Figure 2B:
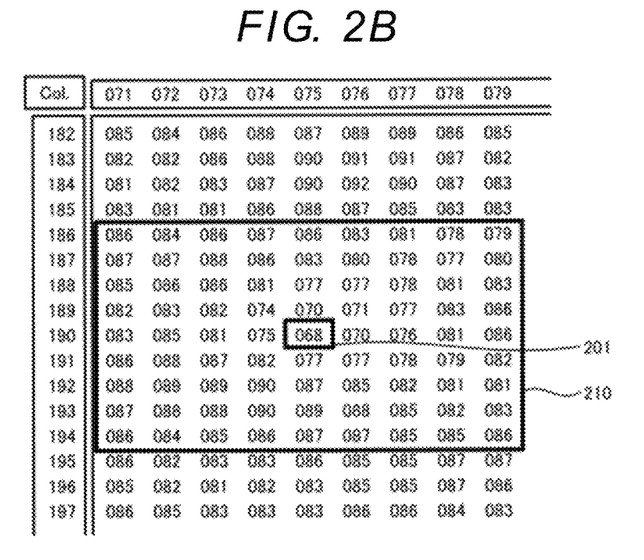
Figure 3A:
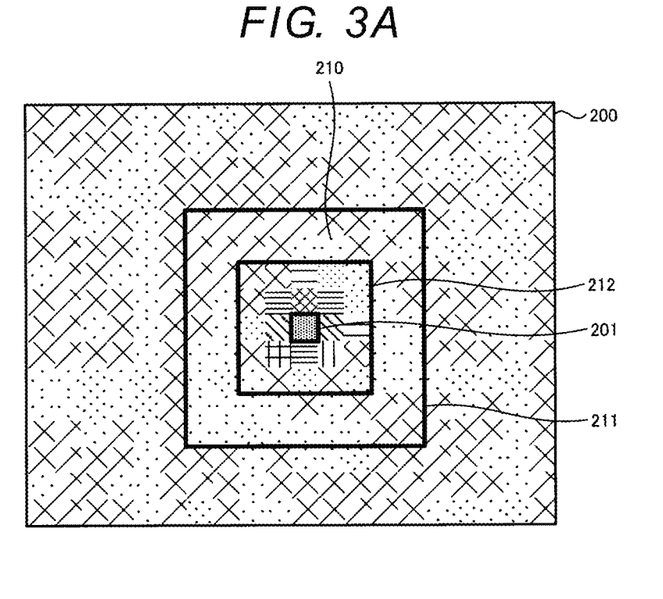
FIGS. 3A and 3B are diagrams illustrating an example of the representative value calculation method.
Figure 3B:
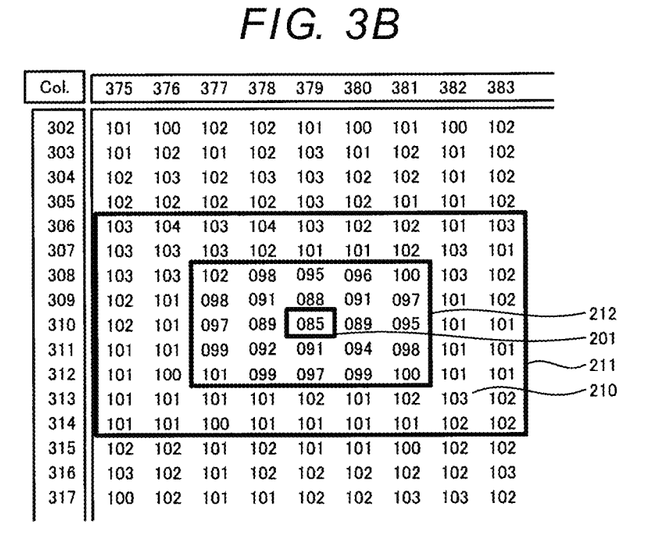

The representative value calculation unit 34 calculates a representative value which is a gray scale value based at the time of performing defect determination on pixels of the sensor image output by the A/D converter 17. The representative value is calculated using pixels in a region of a predetermined range centered on a pixel of interest. FIGS. 2A to 3B are diagrams illustrating examples of representative value calculation method. FIGS. 2A and 3A are diagrams illustrating sensor images and FIGS. 2B and 3B are diagrams illustrating pixels of the sensor images in FIGS. 2A and 3A expressed with gray scale values in a range of 256 gray scale values. In the drawings according to the embodiment, numbers shown in FIGS. 2B and 3B are exemplary.

As shown in FIGS. 2A and 2B, the sensor image 200 is formed of a plurality of pixels (partitioned square masses in FIG. 2A). Here, a 9×9 pixel region centered on a pixel to be evaluated for a defect (hereinafter referred to as a pixel of interest) 201 in the sensor image 200 is set as a representative value calculation region 210. The pixel of interest is, for example, a 1×1 pixel, i.e., a single pixel. In FIGS. 2A and 2B, the representative value calculation region 210 is a region of 9×9 pixels, which is an example. Here, n×n (where n is an odd integer equal to or greater than 3) pixels centered on the pixel of interest can be set as a region of the pixels and thus a representative value calculation region.

In FIGS. 3A and 3B, pixels of an annular region from which a region 212 with 5×5 pixel region 212 centered on the pixel of interest 201 is excluded from a 9×9 pixel region 211 centered on the pixel of interest 201 of the sensor image 200 are set as the representative value calculation region 210. These regions and their number of pixels is exemplary, and a region in which a j×j range of pixels (where j is an odd integer less than i and is equal to or greater than 1) is excluded from a i×i range of pixels (where i is an odd integer equal to or greater than 3 pixels centered on the pixel of interest 201 may be set as the representative value calculation region 210. This is also exemplary and the representative value calculation region 210 can have any shape.

The representative value is considered to be a value based on a calculation result of at least one of an average value, a median value, a maximum value, a minimum value, a mode, a variance, and a standard deviation of all the pixels in the representative value calculation region 210. For example, in the case of FIG. 2B, for the pixels in the representative value calculation region 210, the average value is 82.74, the median value is 83, the maximum value is 90, the minimum value is 68, the mode is 86, the variance is 23.97, and the standard deviation is 4.87.

The representative value data memory unit 35 stores data (representative value data) in which the representative value calculated by the representative value calculation unit 34 is associated with positional information concerning the pixel of interest. The representative value data is, for example, mapping information in which the representative value is applied to each pixel of the sensor image.

The defect determination threshold calculation unit 36 calculates a defect determination threshold from the representative value of the pixel of interest in the representative value data memory unit 35 using a predetermined algorithm (for example, a function determined in advance). The defect determination threshold calculation unit 36 acquires, for example the position of the stage 13 as instructed by the stage control circuit 18, to determine the inspection region (the pattern disposition region in which the inspection target 20 is inspected) based on the design data by the imaging device control unit 31, that is, the defect determination threshold calculation unit 36 determines the representative value synchronized to inspection coordinates from the representative value data and calculates the defect determination threshold using the predetermined algorithm. The defect determination threshold calculation unit 36 outputs the calculated defect determination threshold to the defect determination circuit 53. An algorithm is used which increases sensitivity and increases the defect determination threshold in order to detect smaller defects when gray scales in the periphery of the pixel of interest are relatively low, and decreases the sensitivity and decreases the defect determination threshold when the gray scales in the periphery of the pixel of interest are relatively high.

Figure 4:
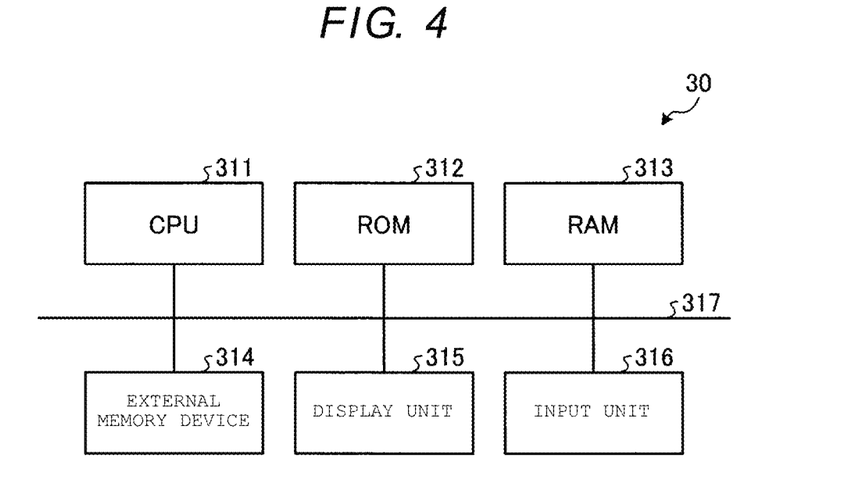
FIG. 4 is a block diagram schematically illustrating an example of a hardware configuration of a computer.

FIG. 4 is a block diagram schematically illustrating an example of a hardware configuration of a computer. A computer 30 includes a central processing unit (CPU) 311, a read-only memory (ROM) 312, a random access memory (RAM) 313 serving as a main memory device, an external memory device 314 such as a hard disk drive (HDD) or a compact disc (CD) drive device, a display unit 315 such as a display device, and an input unit 316 such as a keyboard or a mouse and has a hardware configuration of a general computer in which these units are connected via a bus line 317.

The ROM 312 stores, for example, a processing procedure of the imaging device control unit 31, executed on the CPU, related to imaging of the inspection target 20 or a control program describing processing procedures of the representative value calculation unit 34 and the defect determination threshold calculation unit 36, executed on the CPU, related to defect inspection. The RAM 313 includes, for example, the representative value data memory unit 35. The external memory device 314 includes, for example, the design data memory unit 32 and the sensor image memory unit 33.

The determination unit 50 is a circuit that receives design data from the computer 30 and generates a reference image. The presence or absence of a defect is determined using the defect determination threshold on each pixel from a difference image that shows the difference in gray scale value of a pixel between the desired reference image and the actual or sensed sensor image from the A/D converter 17. The determination unit 50 includes a pattern development circuit 51, a reference image generation circuit 52, and a defect determination circuit 53.

The pattern development circuit 51 acquires the design data of the inspection target 20 from the design data memory unit 32 of the computer 30. The design data is developed into gray scale data of multi-values in a pixel with substantially the same resolution as that of the image sensor 15. When the sensor image has binary values, the pattern development circuit 51 develops the design data into gray scale data with binary values. Hereinafter, gray scale data with multi-values or binary values developed from the design data is also referred to as development data.

The reference image generation circuit 52 generates a reference image to be compared to the sensor image obtained by imaging the inspection target 20. Here, the reference image according to a change in a shape occurring in an etching process or the like for a pattern formed on the inspection target 20 and optical characteristics is generated by performing a filtering process on the development data developed in the pattern development circuit 51. The development data includes data in which, for example, a rectangle or a triangle is combined and the reference image also includes arc data. The pixel size of the reference image is the same (50 nm×50 nm) as the pixel size of the sensor image. A known technology is used to generate the reference image.

The defect determination circuit 53 includes a difference image generation unit 531 and a defect inspection processing unit 532. The difference image generation unit 531 generates a difference image of the difference between the sensor image received from the A/D converter 17 and the reference image received from the reference image generation circuit 52.

The defect inspection processing unit 532 determines the presence or absence of a defect on a pixel of interest in the difference image generated by the difference image generation unit 531 in accordance with a predetermined defect determination algorithm. At this time, presence or absence of a defect is determined using the defect determination threshold acquired from the computer 30 for each pixel of interest. For example, when the representative value of the pixel of interest is small, there is a possibility that a defect signal which is a gray scale value of the pixel of interest is also small. Therefore, the presence or absence of a defect is determined using a defect determination threshold with high sensitivity. Conversely, when the representative value of the pixel of interest is large, the presence or absence of a defect is determined using a defect determination threshold with low sensitivity. Thus, a defect is determined using the defect determination threshold changed according to the gray scale values in the periphery of the pixel of interest.

The pattern development circuit 51, the reference image generation circuit 52, and the defect determination circuit 53 in the determination unit 50 are hardware such as electronic circuits or the like, but may be configured with an information processing device that has software such as a program that executes a function of each processing unit.

Figure 5:
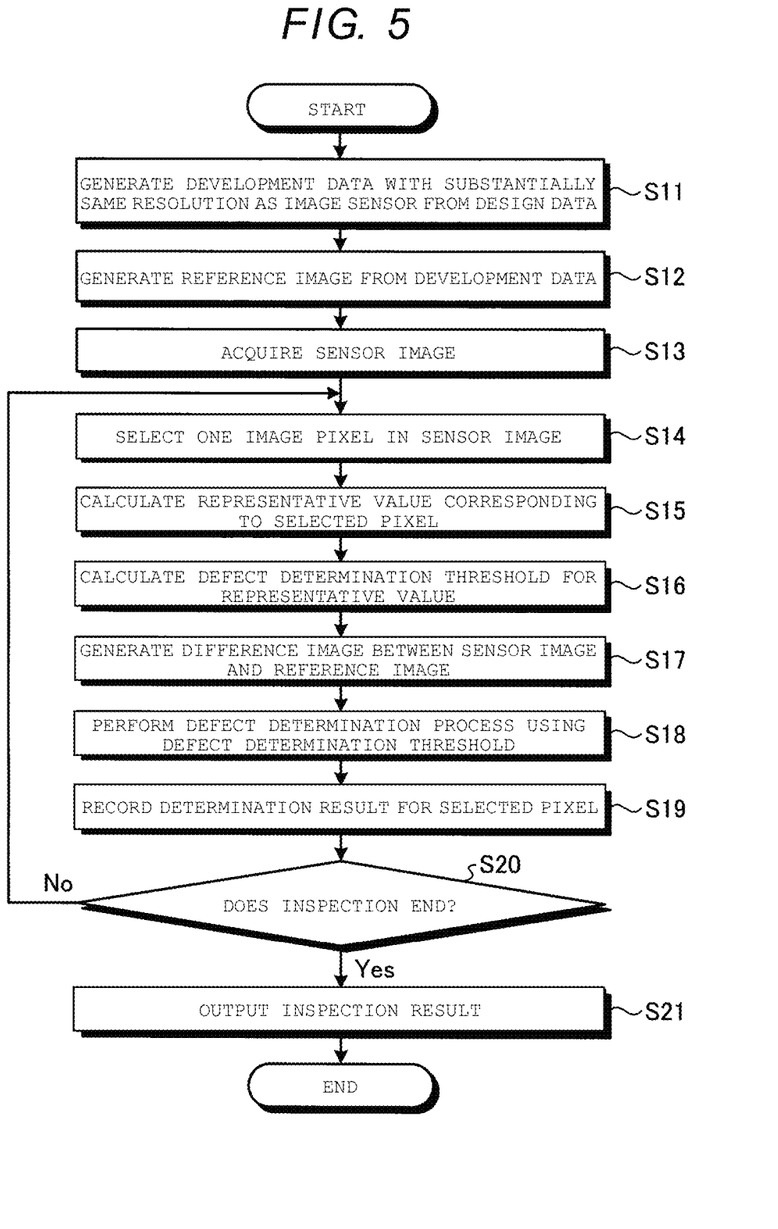
FIG. 5 is a flowchart illustrating an example of a procedure of a defect inspection method according to the first embodiment.

Next, a defect inspection method in the defect inspection device 1 with the configuration will be described. FIG. 5 is a flowchart illustrating an example of a procedure of the defect inspection method according to the first embodiment. For example, a process of generating a reference image is first performed. That is, the pattern development circuit 51 acquires the design data of the inspection target 20 to be inspected from the computer 30 and generates the development data having substantially the same resolution as the resolution of the image of the image sensor 15 of the imaging device 10 (step S11). The development data expresses brightness of each pixel of a pattern obtained from the design data with a gray scale value. Subsequently, the reference image generation circuit 52 generates the reference image in which a pattern shape approaches an actual pattern shape in the inspection target 20 from the development data (step S12). The reference image generation circuit 52 outputs the reference image to the defect determination circuit 53.

Thereafter, the inspection target 20 is put on the stage 13 of the imaging device 10 and the pattern disposition region in the inspection target 20 is imaged by the imaging device 10 under an instruction of the computer 30. In the imaging device 10, an optical image is acquired by the sensor circuit 16 and the sensor image subjected to A/D conversion is acquired by the A/D converter 17 (step S13). The sensor image is output to the computer 30 and the defect determination circuit 53.

Subsequently, the representative value calculation unit 34 of the computer 30 selects one pixel in the sensor image (step S14) and calculates the representative value of the gray scale values corresponding to the selected pixels from the sensor image (step S15). The representative value is calculated using the pixels of the representative value calculation region in the periphery of the selected pixel (the pixel of interest), as described with reference to FIGS. 2A to 3B. A value based on a calculation result of at least one of an average value, a median value, a maximum value, a minimum value, a mode, a variance, and a standard deviation of all the pixels in the representative value calculation region is used as the representative value. The representative value calculation unit 34 stores the calculated representative value as representative value data associated with the selected pixel in the representative value data memory unit 35.

Thereafter, the defect determination threshold calculation unit 36 calculates the defect determination threshold using a predetermined algorithm according to the calculated representative value (step S16) and outputs the defect determination threshold calculated by the defect determination circuit 53.

Subsequently, the difference image generation unit 531 of the defect determination circuit 53 generates the difference image of the differences between the sensor image from the A/D converter 17 and the reference image from the reference image generation circuit 52 (step S17). Thereafter, the defect inspection processing unit 532 performs the defect determination process on a pixel selected in the difference image using the defect determination threshold (step S18). In the defect determination process, the presence or absence of a defect of, for example, a pixel of the difference image corresponding to the selected pixel is determined by comparing the defect determination threshold to the calculation result calculated according to the predetermined defect determination algorithm. Then, the defect determination circuit 53 records a determination result for the selected pixel (step S19).

Thereafter, it is determined whether the inspection ends (step S20). For example, it is determined whether the inspection is performed on all the pixels in the sensor image. When the inspection does not end (No in step S20), the process returns to step S14 and the defect determination process is performed on a subsequent pixel.

Conversely, when the inspection ends (Yes in step S20), the defect inspection processing unit 532 outputs an inspection result (step S21) and the process ends.

In the foregoing description, the representative value is calculated from the sensor image. However, the representative value may be calculated from the reference image generated by the reference image generation circuit 52.

In the first embodiment, the representative value is calculated for each pixel of the sensor image or the reference image using the pixel(s) of the representative value calculation region in a predetermined region including the pixel, and the defect determination threshold corresponding to each representative value is calculated using a predetermined algorithm. When the defect inspection is performed using the difference image between the sensor image and the reference image, presence or absence of a defect is determined on or in the pixel of interest by comparing the defect determination threshold to the calculation result calculated using the predetermined algorithm. That is, the defect is determined while applying the defect determination threshold calculated for each pixel. However, when the inspection target 20 with a pattern having an image resolution equal to or less than a resolution limit is imaged, the defect determination threshold can be changed using the representative value despite a different average gray scale value in a plane of the pattern disposition region of the inspection target 20. As a result, it is possible to obtain an advantage of preventing erroneous detection and performing the inspection with high precision.

Second Embodiment

In a second embodiment, a defect inspection device and a defect inspection method of performing die to die inspection to compare optical images having the same intended pattern at different locations on the same inspection target will be described.

Figure 6:
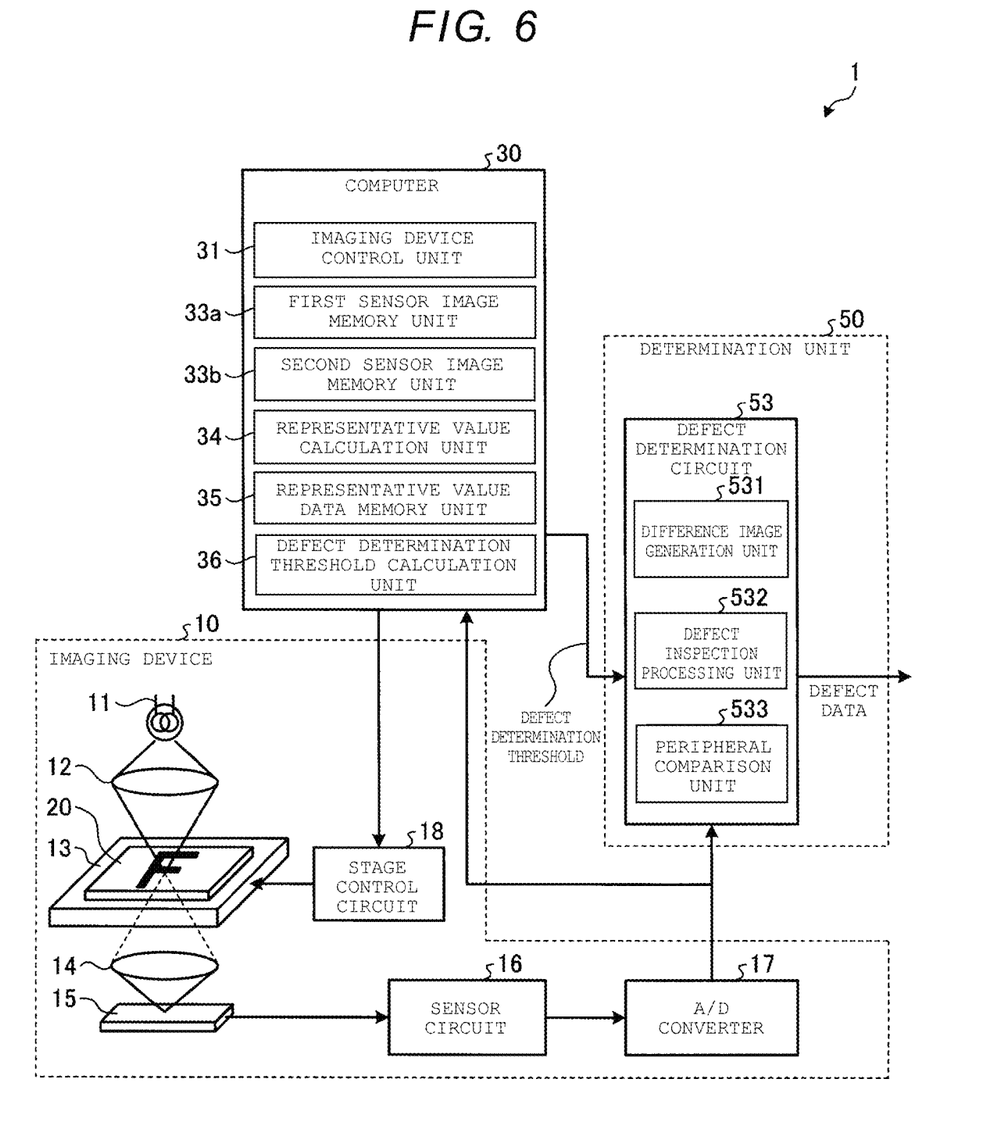
FIG. 6 is a diagram schematically illustrating an example of a configuration of a defect inspection device according to a second embodiment.

FIG. 6 is a diagram schematically illustrating an example of a configuration of the defect inspection device according to the second embodiment. Hereinafter, only differences from the first embodiment will be described.

The computer 30 does not include the design data memory unit 32 and includes two sensor image memory units 33 (a first sensor image memory unit 33a and a second sensor image memory unit 33b). The first sensor image memory unit 33a stores a first sensor image of a first region imaged by the imaging device 10. The second sensor image memory unit 33b stores a second sensor image of a second region with the intended same pattern as a pattern of the first region at a different location than the location of the first region imaged by the imaging device 10.

The representative value calculation unit 34 calculates a representative value in the first sensor image or the second sensor image.

The determination unit 50 does not include the pattern development circuit 51 and the reference image generation circuit 52, and a peripheral comparison unit 533 is further provided in the defect determination circuit 53. The peripheral comparison unit 533 determines whether a sensor image in which there is a defect is the first sensor image or the second sensor image from gray scale values of pixels of interest and peripheral pixels at the periphery of the pixels of interest of the first and second sensor images when defect inspection is performed by the defect inspection processing unit 532. For example, when the determination unit 50 determines that there is the defect, the determination unit 50 determines that there is no defect in the sensor image in which there is no difference in the gray scale values between the pixel of interest and the peripheral pixels and the determination unit 50 determines that there is a defect in the sensor image in which there is a difference in the gray scale values between the pixel of interest and the peripheral pixels. Thus, it is determined whether there is the defect detected in the first sensor image or the second sensor image.

Figure 7:
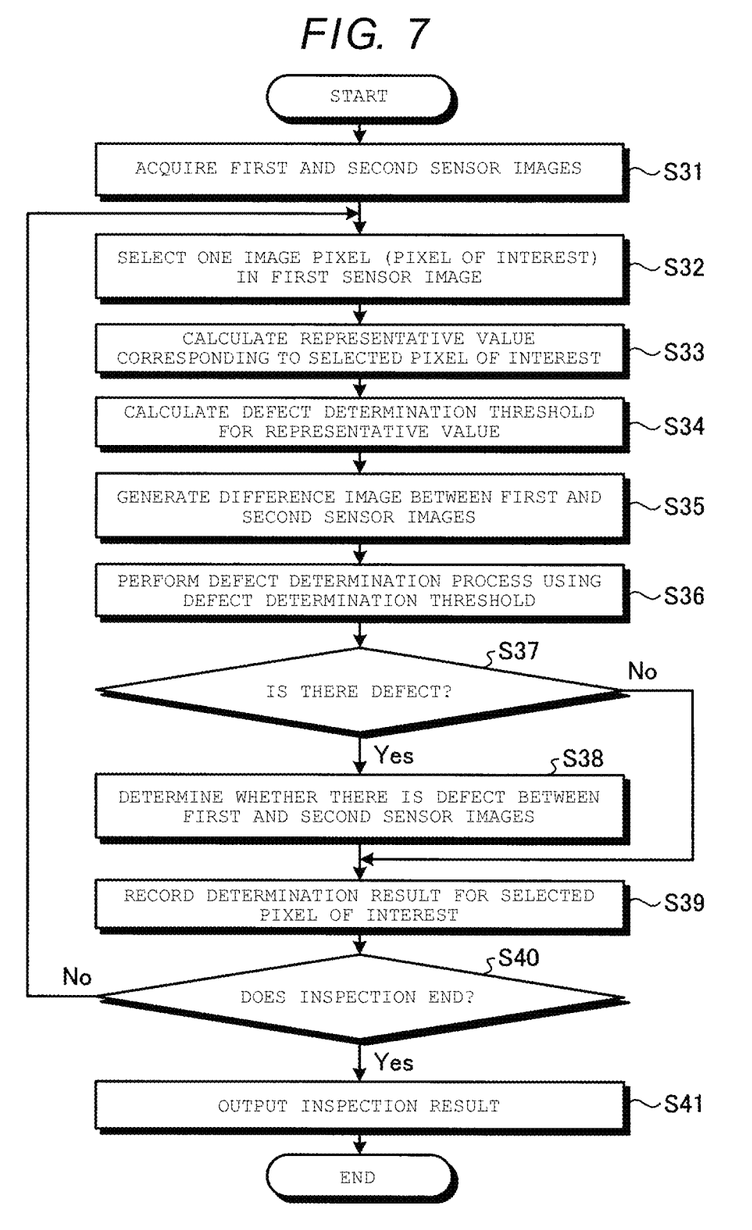
FIG. 7 is a flowchart illustrating an example of a procedure of a defect inspection method according to the second embodiment.

Next, a defect inspection method in the defect inspection device 1 with the configuration will be described. FIG. 7 is a flowchart illustrating an example of a procedure of the defect inspection method according to the second embodiment. The inspection target 20 is first put on the stage 13 of the imaging device 10 and two different pattern disposition regions of the inspection target 20 are imaged by the imaging device 10 under an instruction of the computer 30 to acquire first and second sensor images (step S31). For example, the first sensor image is an image obtained by imaging the first pattern disposition region and the second sensor image is an image obtained by imaging the second pattern disposition region. The first and second sensor images are output to the computer 30 and the defect determination circuit 53.

Subsequently, the representative value calculation unit 34 of the computer 30 selects one pixel (a pixel of interest) in the first sensor image (step S32) and calculates a representative value of the gray scale value corresponding to the selected pixel of interest from the first sensor image (step S33). Thereafter, the defect determination threshold calculation unit 36 calculates the defect determination threshold using a predetermined algorithm according to the calculated representative value (step S34) and outputs the calculated defect determination threshold to the defect determination circuit 53.

Subsequently, the difference image generation unit 531 of the defect determination circuit 53 generates a difference image between the first and second sensor images acquired from the imaging device 10 (step S35). Thereafter, the defect inspection processing unit 532 performs the defect determination process on the pixel of interest selected in the difference image using the defect determination threshold (step S36). In the defect determination process, the presence or absence of a defect of the pixel of selected interest is determined by comparing the defect determination threshold to the calculation result calculated according to the predetermined defect determination algorithm.

When there is the defect (Yes in step S37), the peripheral comparison unit 533 determines whether there is a defect detected as between the first and second sensor images (step S38). For example, the peripheral comparison unit 533 determines that there is the defect detected in the sensor image in which there is a difference in the gray scale value by comparing the degree of change in the gray scale value between the pixel of interest selected in the first sensor image and the pixels peripheral thereto to the degree of change in the gray scale value between the pixel of interest selected in the second sensor image and the pixels peripheral thereto. Thus, it is possible to determine in which region there is the defect as between the first and second pattern disposition regions.

Conversely, when there is no defect detected in step S37 (No in step S37), the defect determination circuit 53 records a determination result for the selected pixel of interest (step S39). Subsequently, it is determined whether the inspection ends (step S40). When the inspection does not end (No in step S40), the process returns to step S32 and the defect determination process is performed on a subsequent pixel. Conversely, when the inspection ends (Yes in step S40), the defect inspection processing unit 532 outputs an inspection result (step S41) and the process ends.

As described above, optical images having the same intended pattern at different locations on the same inspection target 20 have been compared to each other, but optical images at the same intended pattern at the same location on the same inspection target 20 may be compared to each other. In this case, an inspection region is a repetition region in which a repetition pattern is formed rather than an isolated pattern or a unique pattern is not disposed. As the repetition region, a pattern with a so-called line-end-space shape in which a pattern with a line shape is formed in parallel in a direction intersecting an extension direction can be exemplified. The pattern with the line shape may have a straight shape or may have a curved shape.

When the defect inspection is performed in the region with the repetition pattern, presence or absence of a defect can be determined by comparing the second sensor image to the first sensor image, for example, at an interval of one pitch.

In the second embodiment, it is also possible to obtain the same advantages as those of the first embodiment.

Third Embodiment

In the first and second embodiments, the representative value is calculated for each pixel and the defect determination threshold corresponding to the representative value is further calculated. For example, when the pixel has a square size of 50 nm on a side, a calculation amount is considerably large. Thus, there is a concern of a large-scale calculation computer being necessary and the inspection throughput increasing. Accordingly, in a third embodiment, a defect inspection device and a defect inspection method capable of reducing a calculation amount compared to the first and second embodiments will be described.

Figure 8:
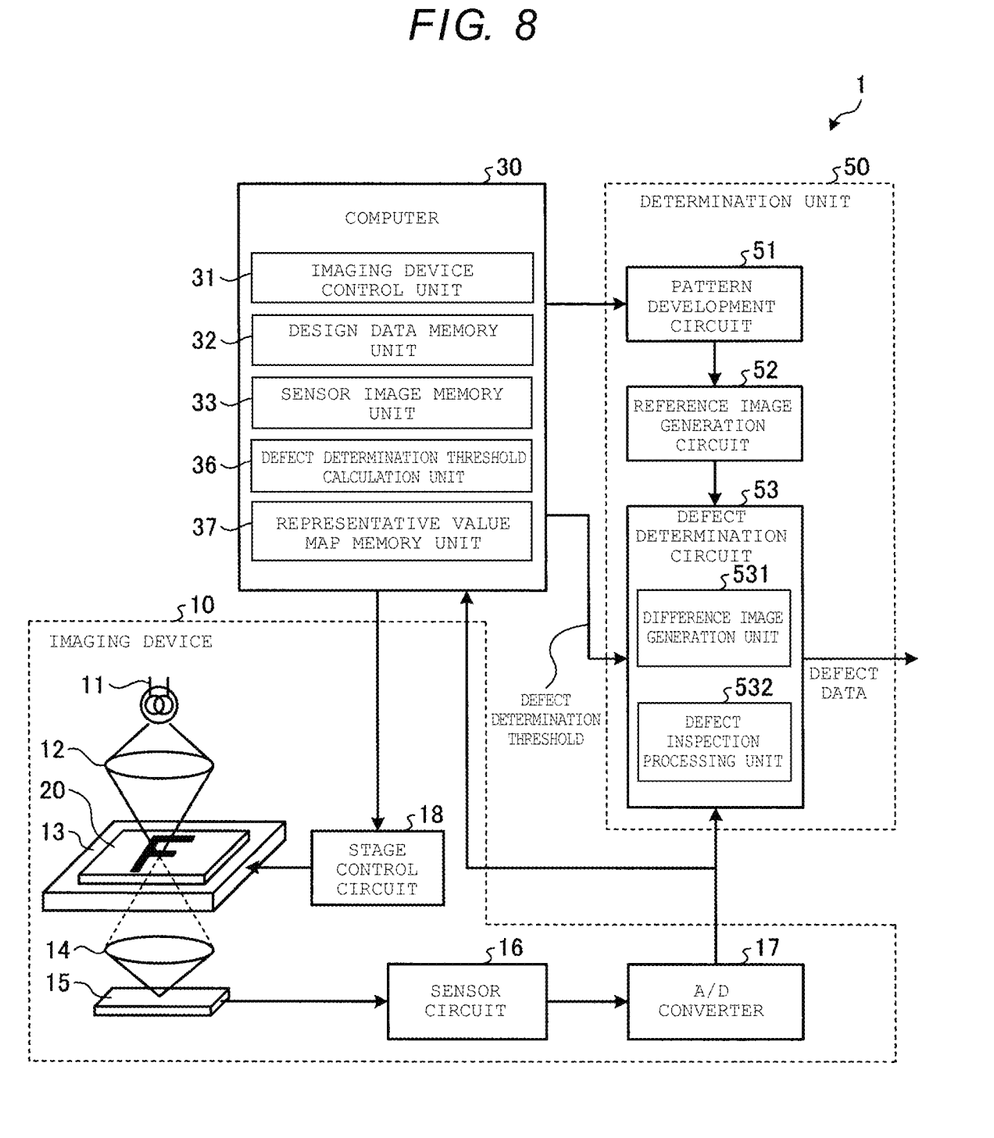
FIG. 8 is a diagram schematically illustrating an example of a configuration of a defect inspection device according to a third embodiment.

FIG. 8 is a diagram schematically illustrating an example of a configuration of a defect inspection device according to the third embodiment. Hereinafter, differences from the first embodiment will be described.

Figure 9:
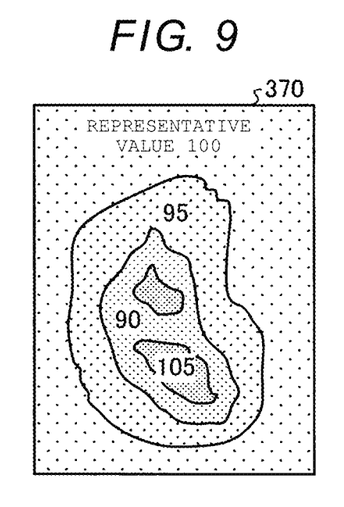
FIG. 9 is a diagram illustrating an example of a representative value map according to the third embodiment.

The computer 30 does not include the representative value calculation unit 34 and the representative value data memory unit 35 and includes a representative value map memory unit 37. The representative value map memory unit 37 stores a representative value map generated based on a map of gray scale values obtained by inspecting a pattern disposition region in which the inspection target 20 is inspected (hereinafter also referred to as an inspection region) in advance. FIG. 9 is a diagram illustrating an example of a representative value map according to the third embodiment. In a representative value map 370, an inspection region is divided using a region with a size greater than the size of a region of pixels on which the defect inspection will occur as a representative value setting unit area and a gray scale value in the representative value setting unit area of each of the divided inspection regions is set as a representative value. The representative value setting unit area is determined according to, for example, the magnitude of a change in the inspection region. For example, when there is no change in a setting unit area less than $25 \times 25$ $\mu m^2$ in the inspection image, the representative value setting unit area can be set to $25 \times 25$ $\mu m^2$. The inspection performed in advance is performed according to an instruction of the imaging device control unit 31 and a result of the inspection is stored in the representative value map memory unit 37.

The defect determination threshold calculation unit 36 calculates a defect determination threshold using the representative value of the setting unit area of the representative value map corresponding to the position of a pixel of interest.

Figure 10:
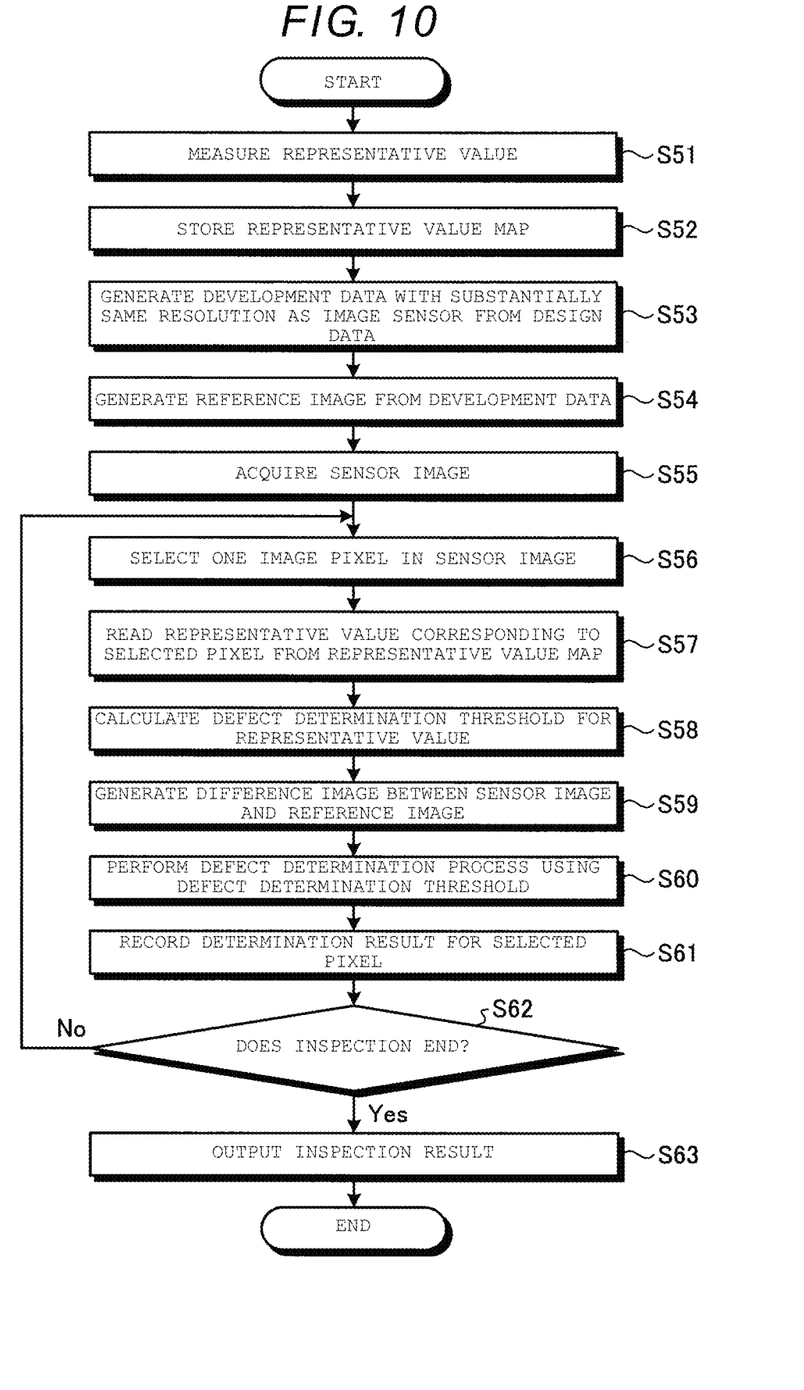
FIG. 10 is a flowchart illustrating an example of a procedure of a defect inspection method according to the third embodiment.

Next, a defect inspection method in the defect inspection device 1 with the configuration will be described. FIG. 10 is a flowchart illustrating an example of a procedure of the defect inspection method according to the third embodiment. The inspection target 20 is put on the stage 13 of the imaging device 10, a representative value of the pattern disposition region on the inspection target 20 is measured under an instruction of the computer 30 (step S51), and a representative value map obtained from the result is stored in the representative value map memory unit 37 (step S52). For example, light is radiated to the pattern disposition region to acquire a sensor image in the representative value setting unit area greater in size than the region of pixels of the image sensor 15 previously acquired at the time of defect inspection to be performed later. By associating gray scale values with the sensor image in each representative value setting unit area, it is possible to obtain the representative value map.

Subsequently, like steps S11 to S13 of FIG. 5 of the first embodiment, a reference image is generated from design data acquired from the computer 30 and a sensor image is acquired in the inspection region of the inspection target 20 by the imaging device 10 (steps S53 to S55).

Thereafter, the defect determination threshold calculation unit 36 of the computer 30 selects one pixel in the sensor image (step S56) and reads the representative value at the position of the selected pixel from the representative value map (step S57). Further, the defect determination threshold calculation unit 36 calculates the defect determination threshold for the read representative value using a predetermined algorithm (step S58) and outputs the calculated defect determination threshold to the defect determination circuit 53.

Thereafter, like steps S17 to S21 of FIG. 5, the defect determination process is performed on each pixel of the difference image of the difference in gray scale value between the sensor image and the reference image using the defect determination threshold, a determination result is recorded. Then, when the inspection all ends, the inspection result is output (steps S59 to S63). As described above, the process ends.

Figure 11:
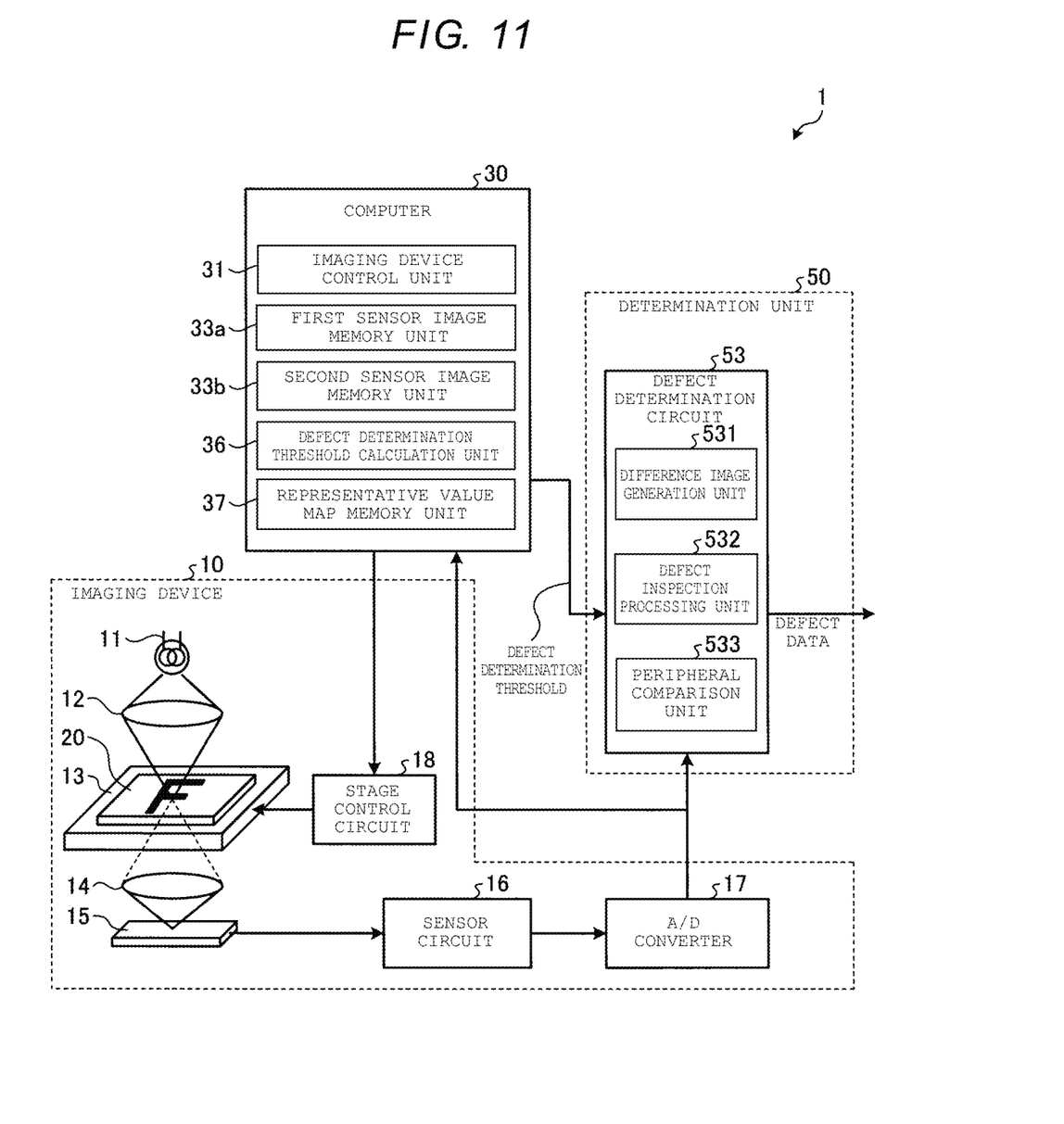
FIG. 11 is a diagram schematically illustrating another example of a configuration of a defect inspection device according to the third embodiment.

A configuration for storing the representative value map obtained by measuring the representative value in advance in the representative value setting unit area can also be applied to the configuration of the second embodiment. FIG. 11 is a diagram schematically illustrating another example of the configuration of the defect inspection device according to the third embodiment. Hereinafter, only differences from the first and second embodiments will be described.

Compared to the case of FIG. 6, the computer 30 does not include the representative value calculation unit 34 and the representative value data memory unit 35 and includes the representative value map memory unit 37. The defect determination threshold calculation unit 36 calculates the defect determination threshold using the representative value in the representative value setting unit area of the representative value map corresponding to the position of the pixel of interest.

Figure 12:
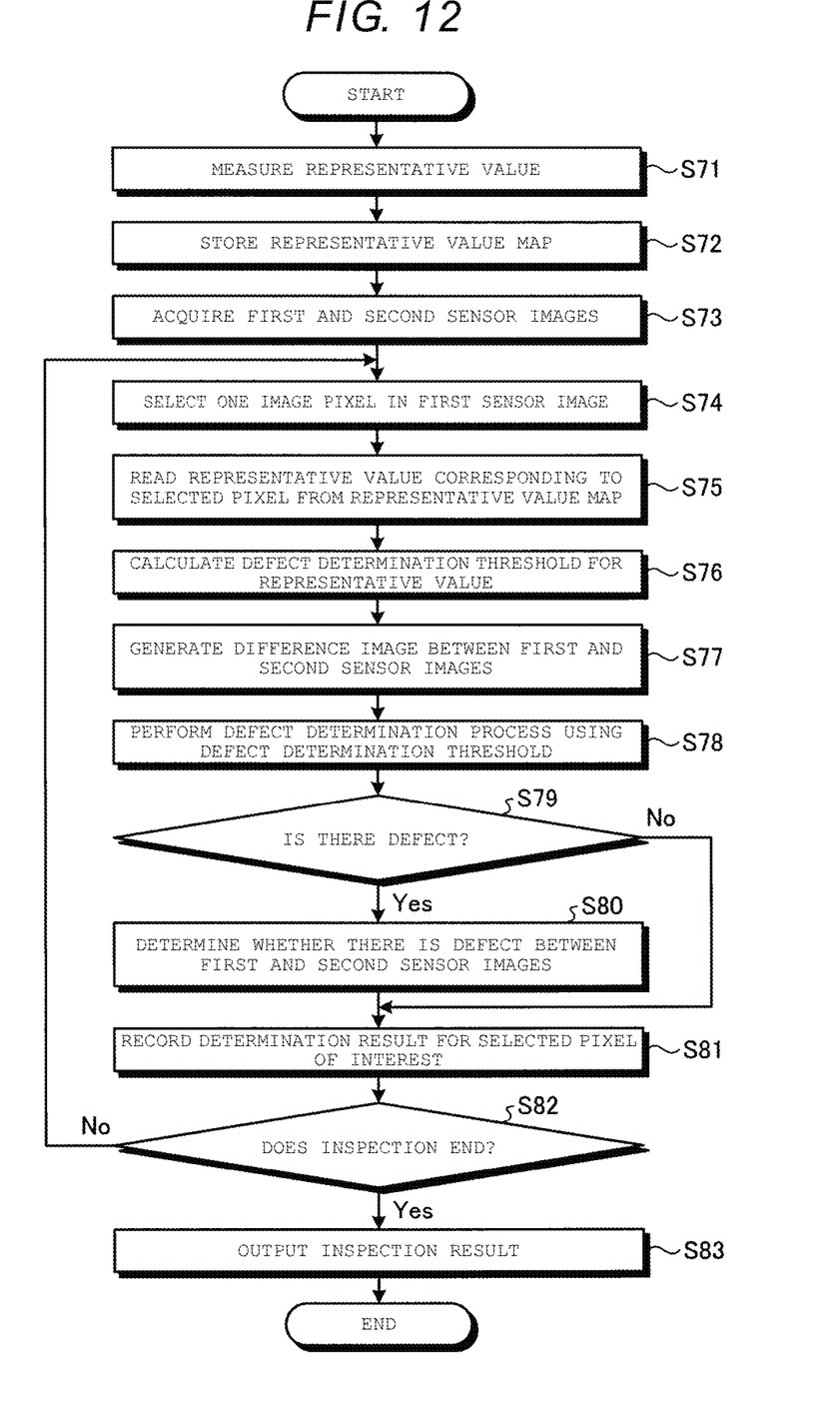
FIG. 12 is a flowchart illustrating another example of the procedure of the defect inspection method according to the third embodiment.

FIG. 12 is a flowchart illustrating another example of the procedure of the defect inspection method according to the third embodiment. Like steps S51 to S52 of FIG. 10, a representative value of an inspection region of the inspection target 20 is measured and the representative value map is stored in the representative value map memory unit 37 of the computer 30 (steps S71 and S72).

Subsequently, two different pattern disposition regions of the inspection target 20 are imaged by the imaging device 10 under an instruction of the computer 30 to acquire first and second sensor images (step S73). The first and second sensor images are output to the computer 30 and the defect determination circuit 53.

Subsequently, the defect determination threshold calculation unit 36 of the computer 30 selects one pixel in the first sensor image (step S74) and reads the representative value at the position of the selected pixel from the representative value map (step S75). Thereafter, the same processes as steps S34 to S41 of FIG. 7 are performed (steps S76 to S83). That is, the defect determination threshold calculation unit 36 calculates the defect determination threshold according to the calculated representative value and outputs the defect determination threshold to the defect determination circuit 53. The defect determination circuit 53 performs the defect determination process on each pixel of the difference image of the difference in gray scale values between the first and second sensor images using the defect determination threshold. When there is a defect, the defect determination circuit 53 determines whether there is the defect as between the first and second sensor images and records the determination result for the selected pixel. When the inspection on all the pixels ends, the defect determination circuit 53 outputs the inspection results. As described above, the process ends.

In the third embodiment, the inspection region of the inspection target 20 is divided in the representative value setting unit area greater in size than the group of pixels of the image sensor 15 acquired at the time of the defect inspection and the representative value map that stores the representative value in each representative value setting unit area is acquired in advance. In the defect inspection of a certain pixel, the defect determination threshold is calculated using the representative value associated in the representative value setting unit area of the representative value map associated with the pixel. Thus, it is possible to obtain the advantage in which a load of the calculation of the representative value in the computer 30 can be reduced. For example, when the size of one side of the representative value setting unit area is set to a size which is 500 times of the size of one side of a pixel, a calculation amount in the computer 30 can be reduced to $1/250000$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A defect inspection device, comprising:
an image sensor configured to obtain an optical image of an inspection target region of an object and to divide the optical image of the inspection target region into an array of pixels of a predetermined two-dimensional size; and
a processor configured to:
receive a signal indicative of a value of a property of the divided optical image created by the image sensor;
select a pixel of the array of pixels in the divided optical image as a first pixel;
determine the value of the property of the first pixel;
determine a reference pixel value for the first pixel based on a reference image of the inspection target region;
determine a representative value for the first pixel by using values of the property for a plurality of second pixels of the array of pixels, the plurality of second pixels including pixels of the array pixels surrounding the first pixel;
set a threshold value for the first pixel based on the representative value; and
determine the presence or absence of a defect in the first pixel by using the threshold value and a difference in the value of the property for the first pixel and the reference pixel value for the first pixel.

2. The defect inspection device of claim 1, wherein the selected property is related to a gray scale value.

3. The defect inspection device of claim 2, wherein the processor is further configured to selectively adjust the threshold value by:
selecting a region in the divided optical image; and
determining a gray scale value for each pixel in a region of pixels surrounding the selected pixel fewer in number of pixels than the number of pixels in the optical image.

4. The defect inspection device according to claim 1, wherein the representative value is at least one of an average value, a median value, a maximum value, a minimum value, a mode, a variance, and a standard deviation of the gray scale values of the plurality of second pixels.

5. The defect inspection device according to claim 1, wherein
the plurality of second pixels includes only those pixels directly adjacent to the first pixel.

6. The defect inspection device according to claim 1, wherein
each pixel in the divided optical image has a border shared with at least one other pixel, and the plurality of second pixels include pixels not sharing a border with the first pixel.

7. The defect inspection device according to claim 1, wherein
each pixel in the divided optical image has a border shared with at least one other pixel, and
the second pixels include only pixels in the divided optical image spaced from the first pixel by at least one pixel in the optical image.

8. The defect inspection device according to claim 1, wherein the processor is further configured to generate the reference image based on design data of the object to determine the reference pixel value for the first pixel.

9. The defect inspection device according to claim 1, wherein the reference image is an optical image of another region of the object.

10. The defect inspection device according to claim 1, wherein the value of the property of second pixels adjacent to the first pixel is obtained before the optical image of an inspection target region of an object is obtained.

11. A defect inspection device comprising a processor configured to:
select a first pixel from first image data from an array of pixels in a divided optical image of an inspection target region;
select a representative value calculation region comprising a plurality of second pixels around a position of the first pixel from the first image data;
calculate a representative value for the first pixel using gray scale values of the plurality of second pixels in the representative value calculation region of the first image data;
calculate a defect determination threshold using the calculated representative value for the first pixel; and
determine the presence or absence of a defect in the first pixel by using the calculated defect determination threshold for first pixel from the first image data and a difference in the gray scale value of the first pixel in the first image data and a reference pixel value for the first pixel calculated from reference image data.

12. The defect inspection device according to claim 11, wherein the processor is further configured to set, as the representative value, at least one value selected from an average value, a median value, a maximum value, a minimum value, a mode, a variance, and a standard deviation of the gray scale values of the plurality of second pixels included in the representative value calculation region.

13. The defect inspection device according to claim 11, wherein the processor is further configured to calculate the defect determination threshold to be lower when gray scale values of the plurality of second pixels included in the representative value calculation region are low as compared to when gray scale values of the plurality of second pixels included in the representative value calculation region are high.

14. The defect inspection device according to claim 11, wherein
each of the first and second pixels have a pixel border shared with at least one other pixel, and
the second pixels include pixels sharing a pixel border with the first pixel.

15. The defect inspection device according to claim 14, wherein the second pixels include pixels not sharing a border with the first pixel.

16. The defect inspection device according to claim 11, wherein
each of the first and second pixels have a pixel border shared with at least one other pixel, and
the second pixels include only pixels sharing a pixel border only with another second pixel.

17. A defect inspection method of dividing an optical image of an inspection region of an inspection target optically imaged by an image sensor into pixels with a predetermined two-dimensional size and detecting a defect on the inspection target by comparing first image data to second image data, said method comprising:
selecting a first pixel from the first image data;
calculating a representative value for the first pixel using gray scale values of second pixels in a representative value calculation region of the second image data, the representative value calculation region surrounding a location corresponding to the location of the first pixel;
calculating a defect determination threshold using the calculated representative value of the first pixel; and
determining the presence or absence of a defect in the first pixel by comparing the defect determination threshold and a difference in a gray scale value for the first pixel in the first image data and the second image data.

18. The method according to claim 17, wherein the representative value is one of an average value, a median value, a maximum value, a minimum value, a mode, a variance, and a standard deviation of the gray scale values of the plurality of second pixels included in the representative value calculation region.

19. The method of claim 17, wherein
the pixels of the optical image share a pixel border with adjacent pixels in the optical image, and
the plurality of second pixels includes pixels sharing a pixel border with the first pixel.

20. The method of claim 17, wherein
the pixels of the optical image share a pixel border with adjacent pixels in the optical image, and
the plurality of second pixels does not include pixels sharing a pixel border with the first pixel.

21. The defect inspection device according to claim 1, wherein the representative value is applied to each pixel of the array of pixels in the divided optical image.

22. The defect inspection device according to claim 11, wherein the representative value is applied to each pixel of the array of pixels in the divided optical image.

* * * * *